(12) United States Patent
Song et al.

(10) Patent No.: US 11,195,590 B2
(45) Date of Patent: Dec. 7, 2021

(54) MEMORY INCLUDING A PLURALITY OF PORTIONS AND USED FOR REDUCING PROGRAM DISTURBANCE AND PROGRAM METHOD THEREOF

(71) Applicant: Yangtze Memory Technologies Co., Ltd., Wuhan (CN)

(72) Inventors: Yali Song, Wuhan (CN); XiangNan Zhao, Wuhan (CN); Ying Cui, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/827,734

(22) Filed: Mar. 24, 2020

(65) Prior Publication Data

US 2021/0249091 A1 Aug. 12, 2021

Related U.S. Application Data

(63) Continuation of application No. PCT/CN2020/074580, filed on Feb. 10, 2020.

(51) Int. Cl.
*G11C 16/34* (2006.01)
*G11C 16/10* (2006.01)
*G11C 16/08* (2006.01)

(52) U.S. Cl.
CPC .......... *G11C 16/3418* (2013.01); *G11C 16/08* (2013.01); *G11C 16/10* (2013.01)

(58) Field of Classification Search
CPC ......... G11C 16/3418; G11C 8/08; G11C 8/14; G11C 16/08
See application file for complete search history.

(56) References Cited

U.S. PATENT DOCUMENTS

| | | | |
|---|---|---|---|
| 6,061,270 A | 5/2000 | Choi | |
| 10,269,570 B2 * | 4/2019 | Lee | ..... G11C 11/5628 |
| 2009/0257280 A1 | 10/2009 | Oh | |
| 2010/0124119 A1 | 5/2010 | Lee | |
| 2012/0294087 A1 | 11/2012 | Seo | |
| 2013/0163326 A1 * | 6/2013 | Lee | ..... G11C 16/3418 365/185.2 |
| 2013/0272067 A1 * | 10/2013 | Lee | ..... G11C 16/0483 365/185.11 |
| 2015/0262682 A1 | 9/2015 | Futatsuyama | |
| 2016/0071595 A1 | 3/2016 | Dong | |

(Continued)

FOREIGN PATENT DOCUMENTS

| | | |
|---|---|---|
| CN | 101567213 A | 10/2009 |
| CN | 101740129 A | 6/2010 |

(Continued)

*Primary Examiner* — Han Yang
(74) *Attorney, Agent, or Firm* — Winston Hsu

(57) ABSTRACT

A memory includes a first portion, a second portion and a controller. The first portion includes a first word line to a kth word line. The second portion is formed above the first portion and includes a (k+1)th word line to an mth word line. When an xth word line is used to perform a program operation, the controller is used to apply a first voltage to the first word line to an (x−2)th word line, a second voltage to an (x−1)th word line, and a third voltage to an (x+1)th word line. x, k and m are positive integers.

5 Claims, 7 Drawing Sheets

(56) References Cited

U.S. PATENT DOCUMENTS

| | | | |
|---|---|---|---|
| 2016/0099060 A1* | 4/2016 | Yoo | G11C 16/0483 365/185.11 |
| 2016/0343414 A1 | 11/2016 | Lee | |
| 2018/0190498 A1 | 7/2018 | Lee | |
| 2019/0006021 A1* | 1/2019 | Ghai | G11C 16/3422 |
| 2019/0206690 A1 | 7/2019 | Lee | |
| 2019/0259456 A1 | 8/2019 | Kwak | |

FOREIGN PATENT DOCUMENTS

| | | |
|---|---|---|
| CN | 102789814 A | 11/2012 |
| CN | 104916319 A | 9/2015 |
| CN | 108281166 A | 7/2018 |
| CN | 110189784 A | 8/2019 |
| CN | 110689913 A | 1/2020 |
| KR | 10-0297602 B1 | 8/2001 |

\* cited by examiner

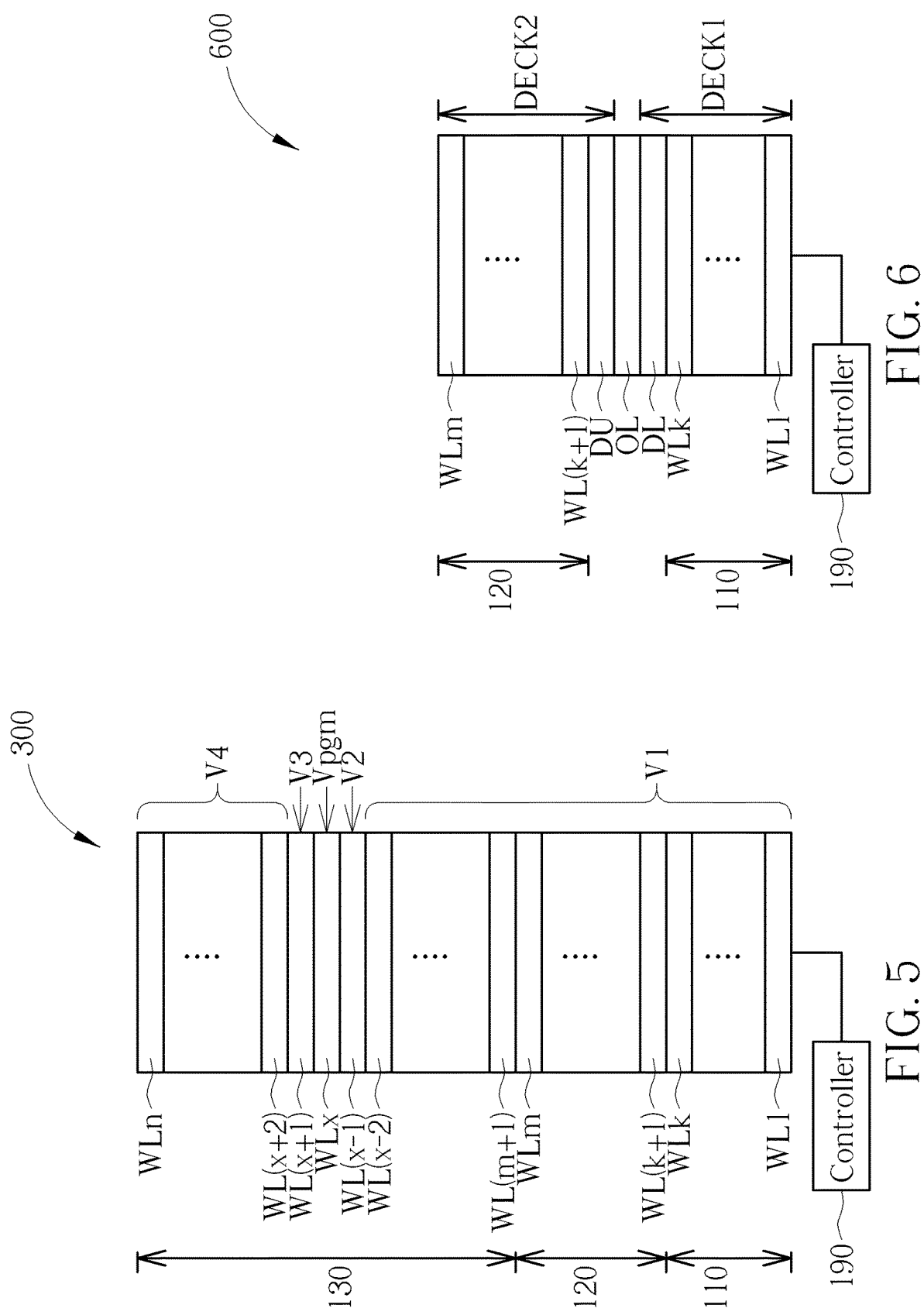

MEMORY INCLUDING A PLURALITY OF PORTIONS AND USED FOR REDUCING PROGRAM DISTURBANCE AND PROGRAM METHOD THEREOF

CROSS REFERENCE TO RELATED APPLICATIONS

This application is a continuation of PCT Application No. PCT/CN2020/074580 filed on 2020 Feb. 10, the entire contents of which are incorporated herein by reference.

BACKGROUND OF THE INVENTION

1. Field of the Invention

The disclosure is related to a memory and a program method, and more particularly, a memory including a plurality of portions and used for reducing program disturbance and a program method thereof.

2. Description of the Prior Art

In order to increase the capacity of a memory, a memory with a three-dimensional structure has been developed. For example, a three-dimensional stack NAND flash memory can be available presently.

A three-dimensional structure of a memory can include a plurality of layers so as to store more data on a same area. This structure has been proved to be effective for increasing capacity of memory.

However, program disturbance will become more significant when the number of layers is increased. Program disturbance will lead to a higher failure rate of programming a memory. In addition, pass voltage disturbance also occurs when using a memory with a plurality of layers.

Hence, a solution for reducing program disturbance and pass voltage disturbance when operating a three-dimensional memory is in need in the field.

SUMMARY OF THE INVENTION

An embodiment provides a memory including a first portion, a second portion and a controller. The first portion includes a first word line to a kth word line from bottom to top. The second portion is formed above the first portion and includes a (k+1)th word line to an mth word line from bottom to top. The controller is used to apply a first voltage to the first word line to an (x−2)th word line, a second voltage to an (x−1)th word line, and a third voltage to an (x+1)th word line when an xth word line is used to perform a program operation. x, k and m are positive integers.

An embodiment provides a memory including a first portion, a second portion and a controller. The first portion includes an (m+1)th word line to an nth word line from bottom to top. The second portion is formed below the first portion and includes a (k+1)th word line to an mth word line from bottom to top. The controller is used to apply a first voltage to an (x+2)th word line to the nth word line, a second voltage to an (x+1)th word line, a third voltage to an (x−1)th word line, a fourth voltage to the (m+1)th word line to an (x−2)th word line, and a fifth voltage to the (k+1)th word line to the mth word line when an xth word line is used to perform a program operation. x, k and m are integers. The fifth voltage is lower than the fourth voltage.

An embodiment provides a program method used for operating a memory. The memory includes a first portion and a second portion. The first portion includes a first word line to a kth word line from bottom to top. The second portion is formed above the first portion and includes a (k+1)th word line to an mth word line from bottom to top. The program method includes applying a first voltage to the to the first word line to an (x−2)th word line when an xth word line is used to perform a program operation; applying a second voltage to an (x−1)th word line; and applying a third voltage to an (x+1)th word line.

An embodiment provides a program method used for operating a memory. The memory includes a first portion and a second portion formed below the first portion. The first portion includes an (m+1)th word line to an nth word line from bottom to top. The second portion includes a (k+1)th word line to an mth word line from bottom to top. The program method includes applying a first voltage to an (x+2)th word line to the nth word line when an xth word line is used to perform a program operation; applying a second voltage to an (x+1)th word line; applying a third voltage to an (x−1)th word line; applying a fourth voltage to the (m+1)th word line to an (x−2)th word line; and applying a fifth voltage to the (k+1)th word line to the mth word line. x, k and m are integers. The fifth voltage is lower than the fourth voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 and FIG. 5 illustrate the memory of FIG. 3 operated in other conditions.

FIG. 6 illustrates a memory according to another embodiment.

DETAILED DESCRIPTION

Figure 1:
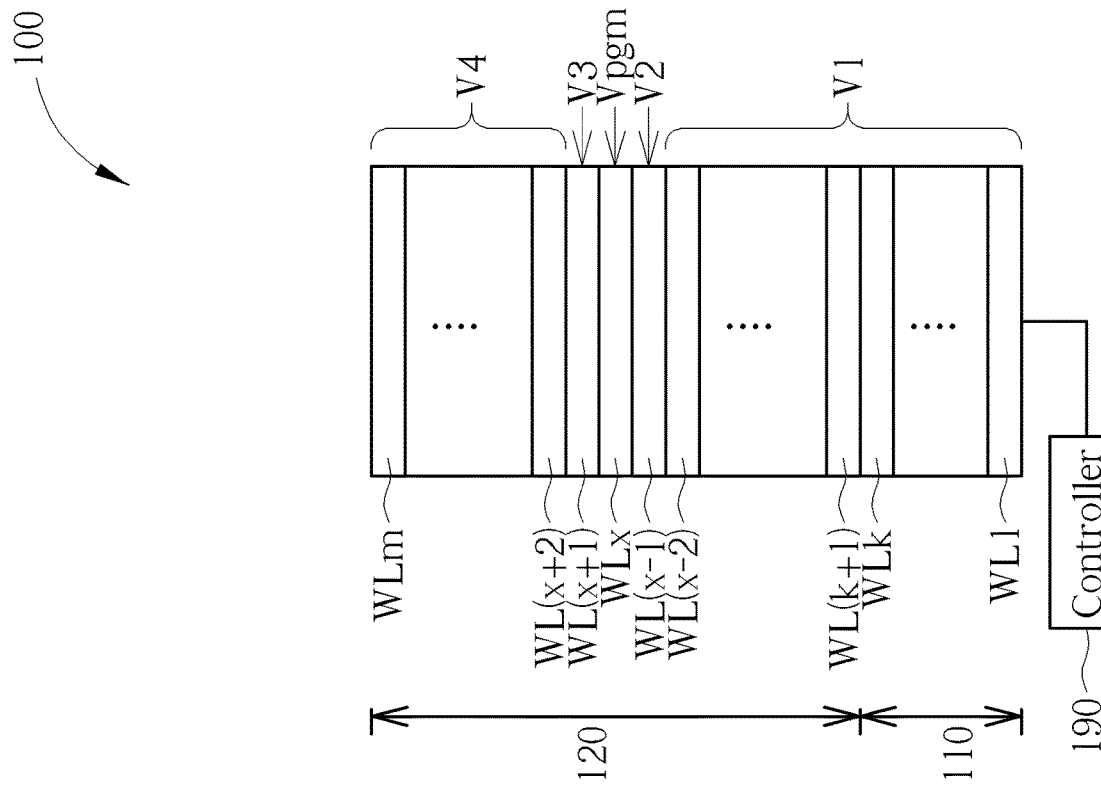
FIG. 1 illustrates a memory according to an embodiment.

FIG. 1 illustrates a memory 100 according to an embodiment. The memory 100 may include a first portion 110, a second portion 120 and a controller 190. The first portion 110 may include a first word line WL1 to a kth word line WLk from bottom to top. The second portion 120 may be formed above the first portion 110 and includes a (k+1)th word line WL(k+1) to an mth word line WLm from bottom to top.

In the text, when a word line is said to be programmed, it may mean the word line is used to performed a program operation. A program operation said in the text may be an operation for programming a memory cell formed using, for example, a set of transistors.

When an xth word line WLx is used to performed a program operation, the controller 190 may apply a program voltage Vpgm to the xth word line WLx; the controller 190 may apply a first voltage V1 to the first word line WL1 to an (x−2)th word line WL(x−2); the controller 190 may apply a second voltage V2 to an (x−1)th word line WL(x−1); and the controller 190 may apply third voltage V3 is applied to an (x+1)th word line WL(x+1). x, k and m are positive integers, 1<k<m and 3≤x.

As shown in FIG. 1, the controller 190 may apply a fourth voltage V4 to an (x+2)th word line WL(x+2) to the mth word line WLm when the xth word line WLx is used to performed the program operation, and x<m−1.

In FIG. 1, the xth word line WLx is located in the first portion 110 as an example; however, the xth word line WLx may be located in the second portion 120 in another condition.

Figure 2:
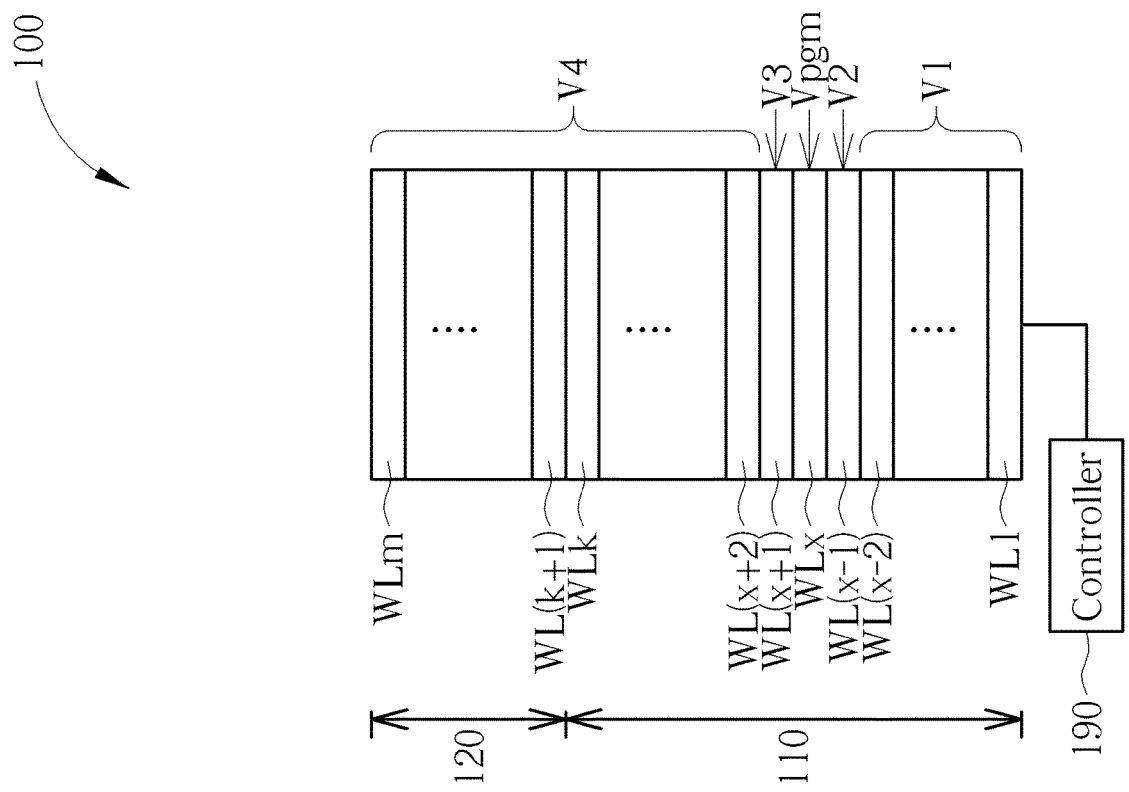
FIG. 2 illustrates the memory of FIG. 1 operated in another condition.

FIG. 2 illustrates the memory 100 of FIG. 1 operated in another condition. In FIG. 2, the xth word line WLx is located in the second portion 120. Regarding voltages applied, FIG. 2 may be similar to FIG. 1, and it is not repeatedly described.

FIG. 1 and FIG. 2 are merely examples, and each of the word lines WL(x−2), WL(x−1), WL(x+1) and WL(x+2) mentioned above is allowed to be located in the first portion 110 or the second portion 120.

Regarding the memory 100, the first voltage V1 may have a first level if the xth word line WLx is in the first portion 110 and a second level if the xth word line WLx is in the second portion 120, where the first level may be lower than the second level. For example, the first voltage V1 in FIG. 1 may have a lower value than the first voltage V1 in FIG. 2.

Figure 3:
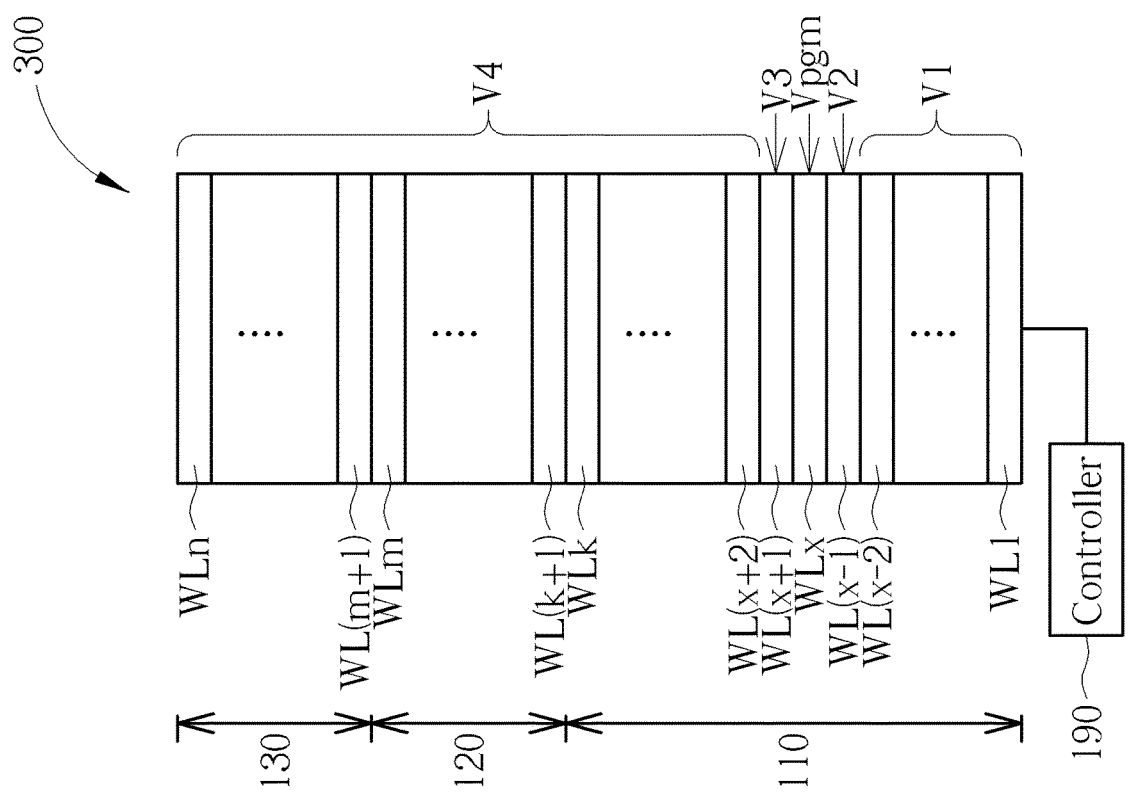
FIG. 3 illustrates a memory according to another embodiment.

FIG. 3 illustrates a memory 300 according to another embodiment. Regarding the memories 100 and 300, the memory 300 may include a third portion 130 in addition to the first portion 110 and the second portion 120.

The third portion 130 may be formed above the second portion 120 and includes an (m+1)th word line WL(m+1) to an nth word line WLn from bottom to top. As shown in FIG. 3, the controller 190 may apply a fourth voltage V4 to the (x+2)th word line WL(x+2) to the nth word line WLn when the xth word line WLx is used to performed the program operation, m<n, and x<(n−1).

Figure 4:
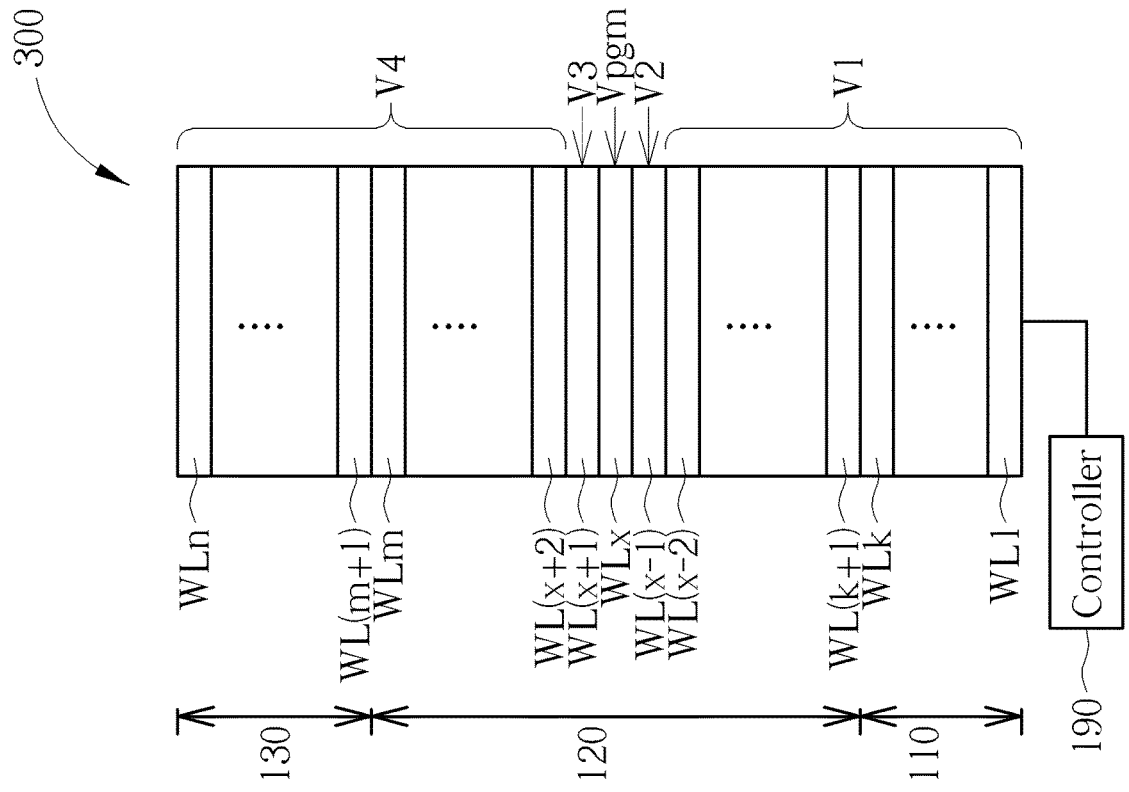

FIG. 4 and FIG. 5 illustrate the memory 300 of FIG. 3 operated in other conditions. In FIG. 3, the xth word line WLx used to performed a program operation is in the first portion 110. In FIG. 4 and FIG. 5, the xth word line WLx is in the second portion 120 and the third portion 130 respectively.

FIG. 3 to FIG. 5 are merely examples, and each of the word lines WL(x−2), WL(x−1), WL(x+1) and WL(x+2) mentioned above is allowed to be located in the first portion 110, the second portion 120 or third portion 130.

Regarding the memory 300, the first voltage V1 may have a first level if the xth word line WLx is in the first portion 110, a second level if the xth word line WLx is in the second portion 120, and a third level if the xth word line WLx is in the third portion 130, where the first level may be lower than the second level, and the second level may be lower than the third level. For example, the first voltage V1 in FIG. 3 may have a lower value than the first voltage V1 in FIG. 4, and the first voltage V1 in FIG. 4 may have a lower value than the first voltage V1 in FIG. 5.

FIG. 6 illustrates a memory 600 according to another embodiment. The memory 600 may be similar to the memory 100 of FIG. 1 and FIG. 2. However, the structure of FIG. 1 and FIG. 2 may include merely one deck, and the memory 600 may have a structure of two decks. In other word, the memory 100 may have a one-deck structure, and the memory 600 may have a two-deck structure. As shown in FIG. 6, the first portion 110 is of a deck DECK1, and the second portion 120 is of a deck DECK2. The two decks DECK1 and DECK2 may be separated by a joint oxide layer OL. The memory 600 may include a lower dummy word line DL, an upper dummy word line DU and the joint oxide layer OL. The lower dummy word line DL may be formed above the first portion 110. The upper dummy word line DU may be formed below the second portion 120. The joint oxide layer OL may be formed between the lower dummy word line DL and the upper dummy word line DU. The voltages applied to a one-deck structure may be like the voltages applied to a two-deck structure according to embodiments. For example, the voltages applied to the word lines of the memory 600 may be like the voltages applied to the word lines of the memory 100 of FIG. 1 and FIG. 2, and it is not repeatedly described.

Figure 8:
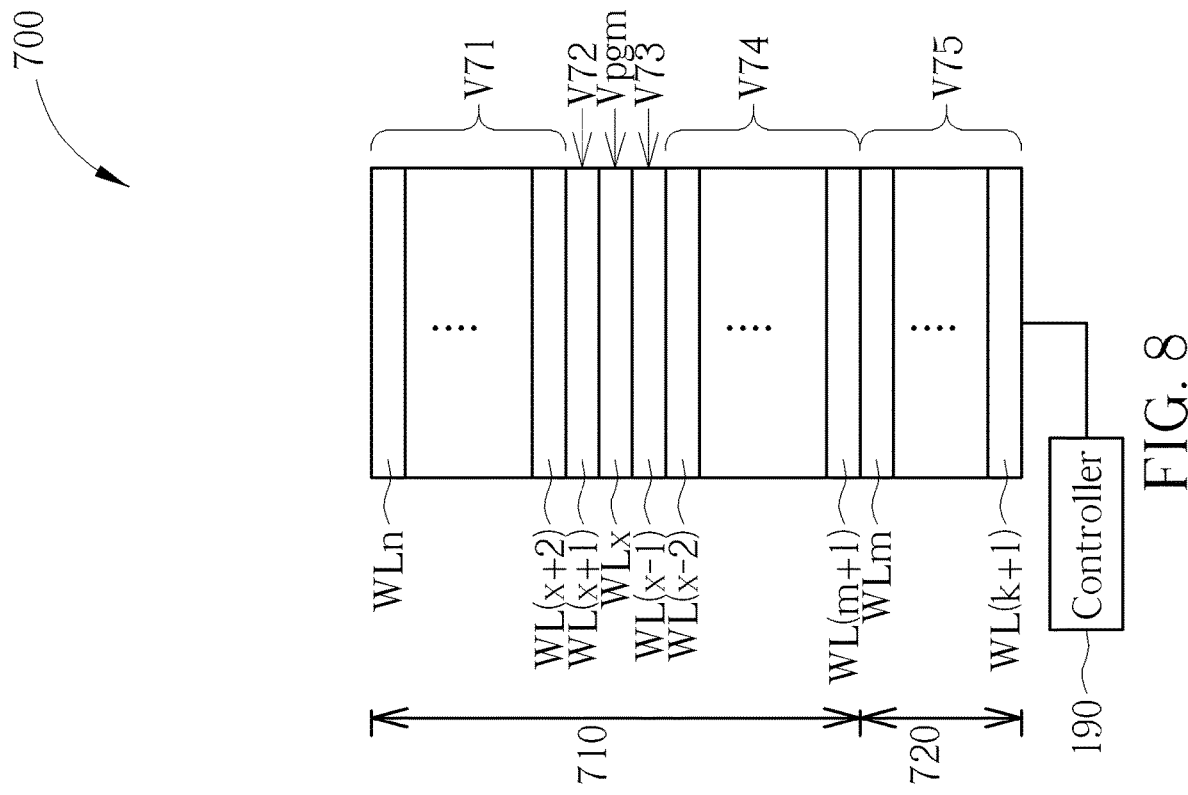
FIG. 8 illustrates the memory of FIG. 7 operated in another condition.
Figure 7:
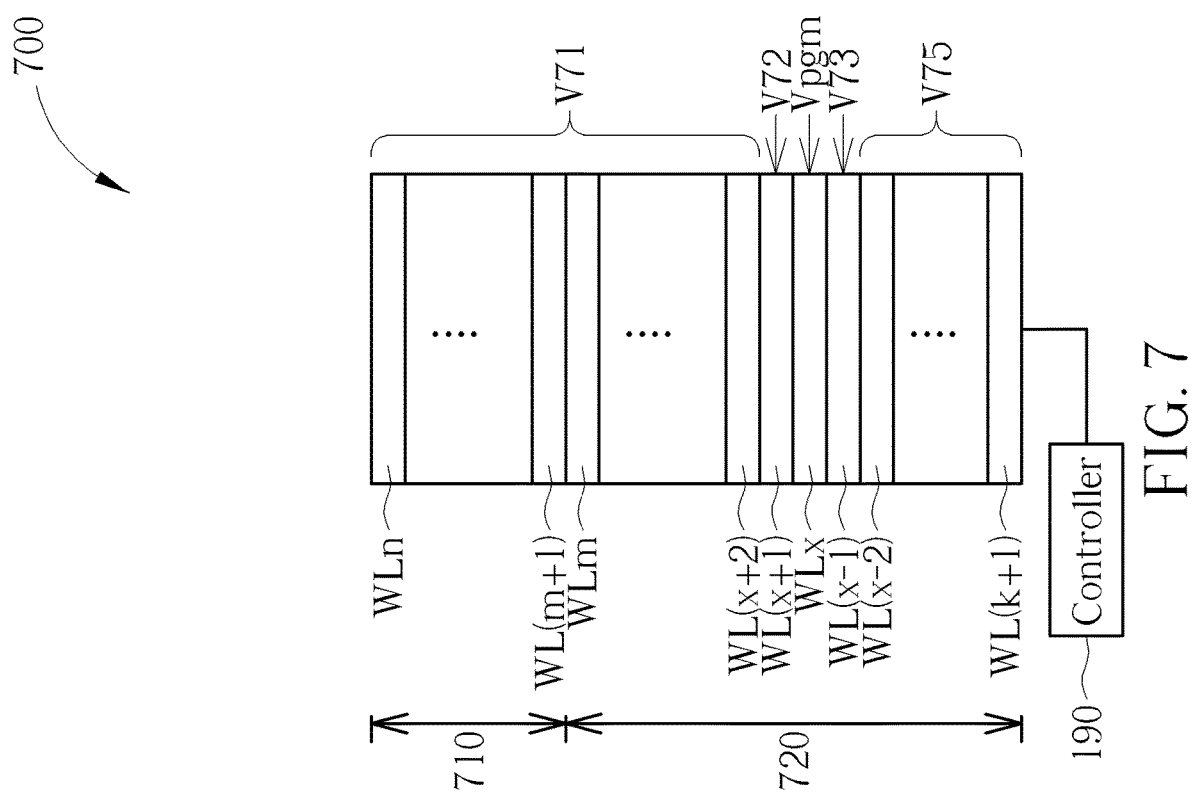
FIG. 7 illustrates a memory according to another embodiment.

FIG. 7 and FIG. 8 illustrate a memory 700 operated in two conditions according to another embodiment. The memory 700 may include a first portion 710, a second portion 720 and a controller 190. The first portion 710 may include an (m+1)th word line WL(m+1) to an nth word line WLn from bottom to top. The second portion 720 may be formed below the first portion 710 and include a (k+1)th word line WL(k+1) to an mth word line WLm from bottom to top.

When an xth word line is used to performed a program operation, the controller 190 may apply a first voltage V71 to an (x+2)th word line WL(x+2) to the nth word line WLn; the controller 190 may apply a second voltage V72 to an (x+1)th word line WL(x+1); and the controller 190 may apply a third voltage V73 to an (x−1)th word line WL(x−1).

If the word line WLx is located in the second portion 720 as shown in FIG. 7, when the xth word line is used to performed the program operation, the controller 190 may apply a fifth voltage V75 to the (k+1)th word line WL(k+1) to an (x−2)th word line WL(x−2). In FIG. 7, x, k and m are integers, (k+2)<x<(m+1). The condition of FIG. 7 may be substantially similar to the condition of FIG. 1; however, FIG. 7 is provided to introduce FIG. 8 to FIG. 11.

If the word line WLx used to performed a program operation is located in the first portion 710 as shown in FIG. 8, the first voltage V71, the second voltage V72 and the third voltage V73 may be applied by the controller 190 as shown in FIG. 7; however, the controller 190 may apply a fourth voltage V74 to the (m+1)th word line WL(m+1) to an (x−2)th word line WL(x−2). The controller 190 may apply the fifth voltage V75 to the (k+1)th word line WL(k+1) to the mth word line WLm. In FIG. 8, x, k and m are integers, 0≤k<m, (m+2)<x<(n−1). The fifth voltage V75 may be lower than the fourth voltage V74.

According to another embodiment, as shown in FIG. 6, the first portion 710 and the second portion 720 shown in FIG. 7 and FIG. 8 may be of two decks respectively, and the two decks may be separated by a joint oxide layer. As shown in FIG. 6, the two decks may have an upper dummy word line and a lower dummy word line respectively.

Figure 10:
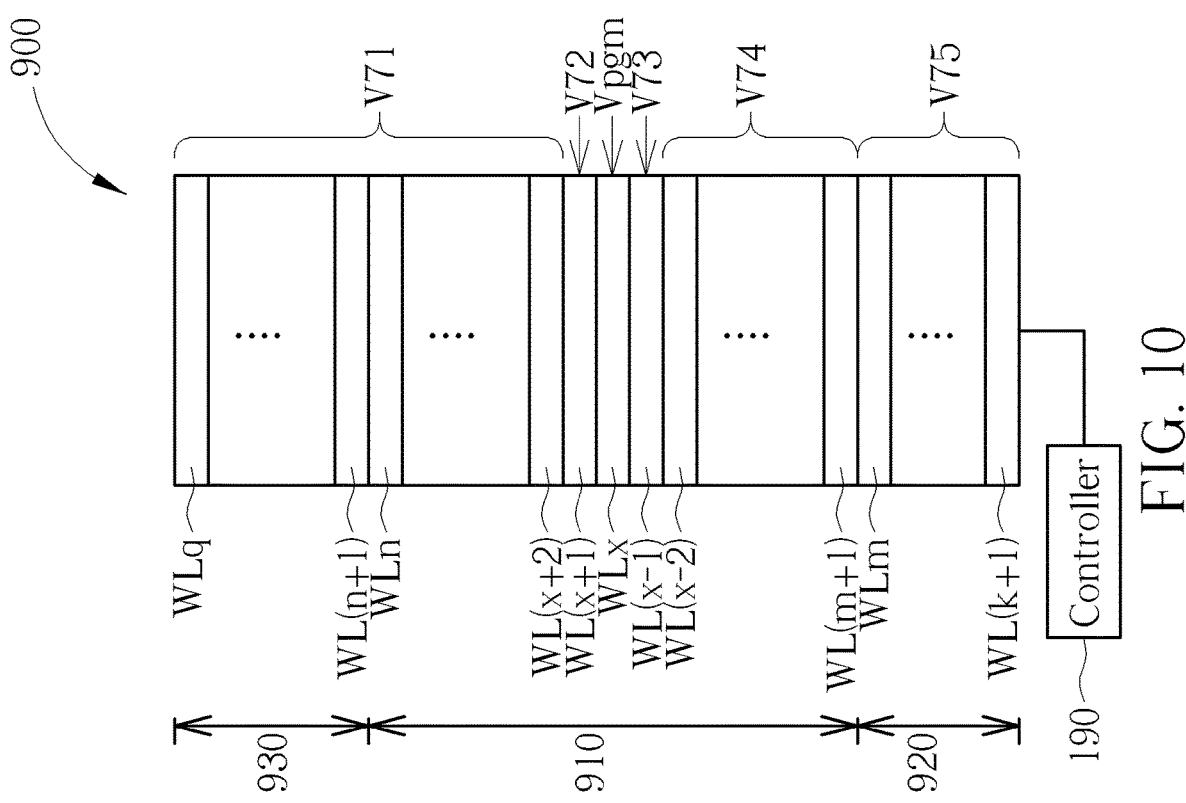
FIG. 10 illustrates the memory of FIG. 9 operated in another condition.
Figure 9:
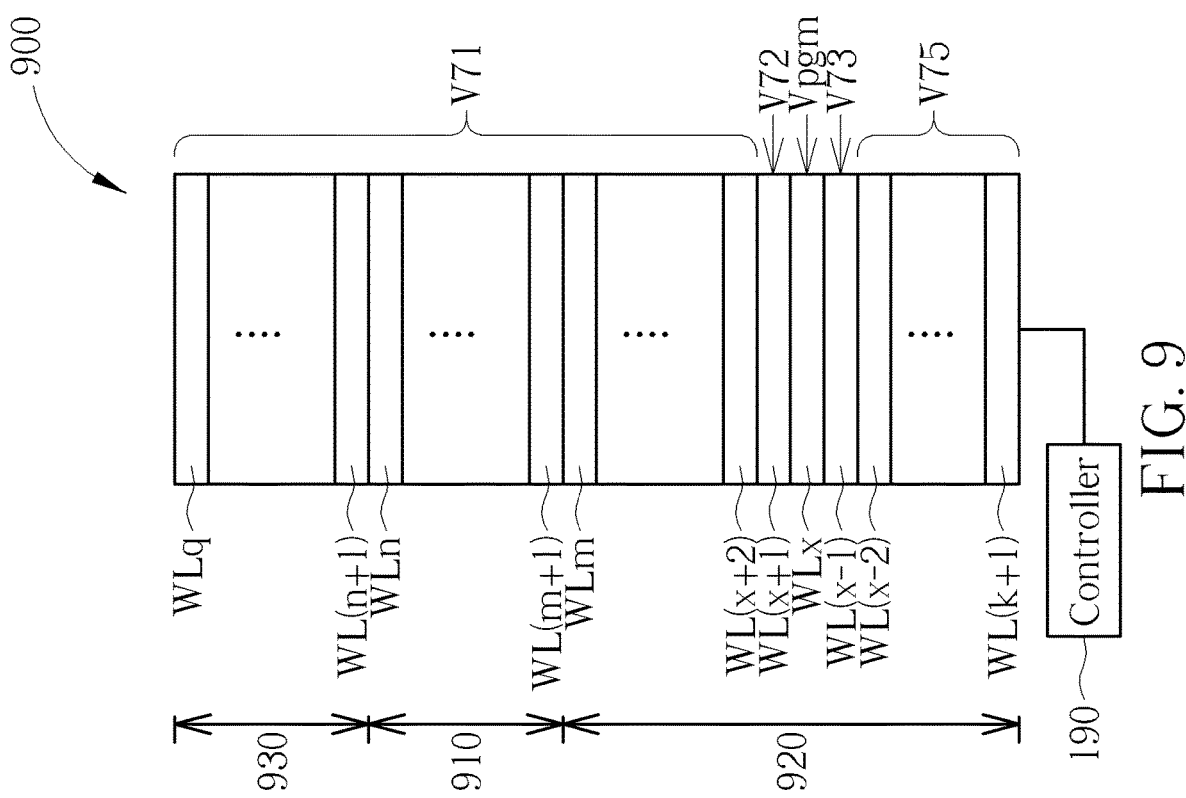
FIG. 9 illustrates a memory according to another embodiment.

FIG. 9 illustrates a memory 900 according to another embodiment. FIG. 10 illustrates the memory 900 of FIG. 9 operated in another condition.

As shown in FIG. 9, the memory 900 may have three portions 910, 920 and 930. The first portion 910 and the second portion 920 may be similar to the portions 710 and 720 shown in FIG. 7. The third portion 930 may be formed above the first portion 910 and include a plurality of word lines WL(n+1) to WLq from bottom to top. The condition of FIG. 9 may be similar to FIG. 7 where the word line WLx used to performed a program operation is located in the lowermost portion 920. The controller 190 may apply the first voltage V71 to the plurality of word lines WL(n+1) to WLq of FIG. 9. The variable q is an integer, and q>(n+1).

The memory 900 of FIG. 10 may have the same structure as shown in FIG. 9. The condition of FIG. 10 may be similar to FIG. 8 where the word line WLx used to performed a program operation is located in the portion 910 above the lowermost portion 920. The voltages applied to the portions 910 and 920 may be like the voltages applied to the portions 710 and 720 of FIG. 8. As shown in FIG. 9, the controller 190 may apply the first voltage V71 to the plurality of word lines WL(n+1) to WLq of the portion 930.

Figure 11:
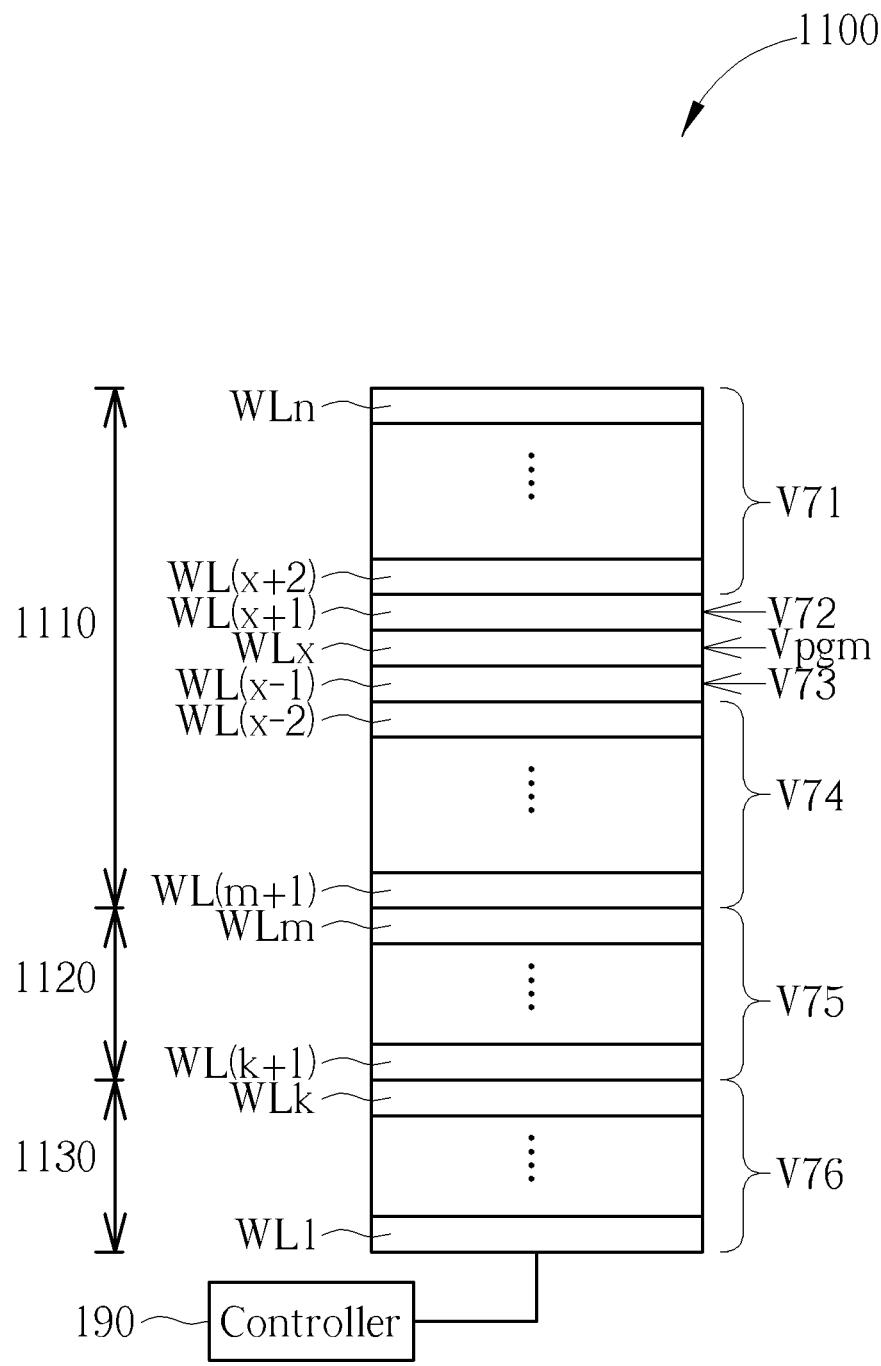
FIG. 11 illustrates a memory according to another embodiment.

FIG. 11 illustrates a memory 1100 according to another embodiment. The first portion 1110 and the second portion 1120 of the memory 1100 may be like the portions 710 and 720 of FIG. 8, and the memory 1100 may further include a third portion 1130 formed below the second portion 1120. Similarly, the xth word line WLx may be used to perform a program operation. Hence, the memory 1100 may include three portions and have a structure like the memory 900 of FIG. 9 and FIG. 10. As shown in FIG. 11, the third portion 1130 may include a first word line WL1 to a kth word line WLk from bottom to top. The controller 190 may apply a six voltage V76 to the first word line WL1 to the kth word line WLk. 0<k, and the sixth voltage V76 is lower than the fifth voltage V75.

Although the numberings of the portions and word lines are not the same, the memories 900 and 1100 shown in FIG. 9 to FIG. 11 may be regarded as a same memory operated in different conditions.

In FIG. 9, the word line (e.g., WLx) used to performed a program operation is located in a lowermost portion of the three portions.

In FIG. 10, the word line (e.g., WLx) used to performed a program operation is located in a second lowermost portion of the three portions.

In FIG. 11, the word line (e.g., WLx) used to performed a program operation is located in an uppermost portion of the three portions.

As shown in FIG. 9 to FIG. 11, when the word line WLx used to performed a program operation is located in the different portions, different voltages may be applied to the word lines below the word line WLx according to the corresponding portion(s).

In the example of FIG. 9 to FIG. 11, the relationship among voltages may be V76<V75<V74. In other words, a same voltage may be applied to word lines of a same portion located below the portion corresponding to the word line (e.g., WLx) used to performed a program operation, and a lower voltage may be applied to word lines of a portion located lower.

Figure 12:
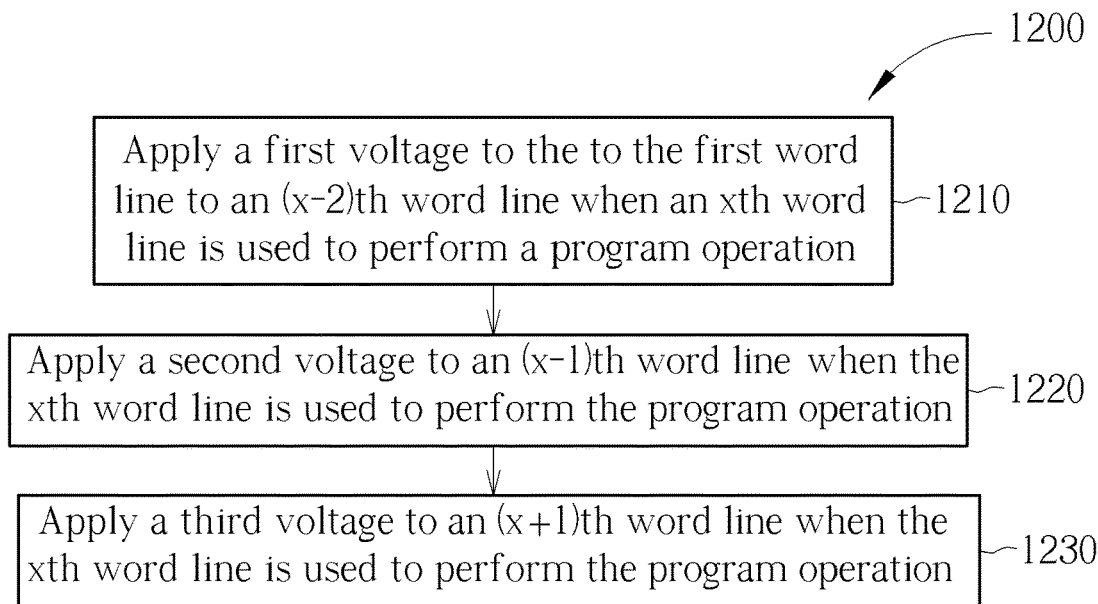
FIG. 12 illustrates a flowchart of an program method according to an embodiment

FIG. 12 illustrates a flowchart of a program method 1200 according to an embodiment. The program method 1200 may be used to operate the memory 100 of FIG. 1 and FIG. 2 and the memory 300 of FIG. 3 to FIG. 5. The method 1200 may include following steps.

Step 1210: apply a first voltage V1 to the to the first word line WL1 to an (x−2)th word line WL(x−2) when an xth word line WLx is used to perform a program operation;

Step 1220: apply a second voltage V2 to an (x−1)th word line WL(x−1); and

Step 1230: apply a third voltage V3 to an (x+1)th word line WL(x+1).

Step 1210 to Step 1230 may be performed when the xth word line WLx is used to perform the program operation. In addition, when the xth word line WLx is used to perform the program operation, a fourth voltage V4 may be applied as show in FIG. 1 to FIG. 5 and as described above. The relationships among the voltages (e.g. V1, V2, V3 and V4) shown in FIG. 1 to FIG. 5 may be as described above.

Figure 13:
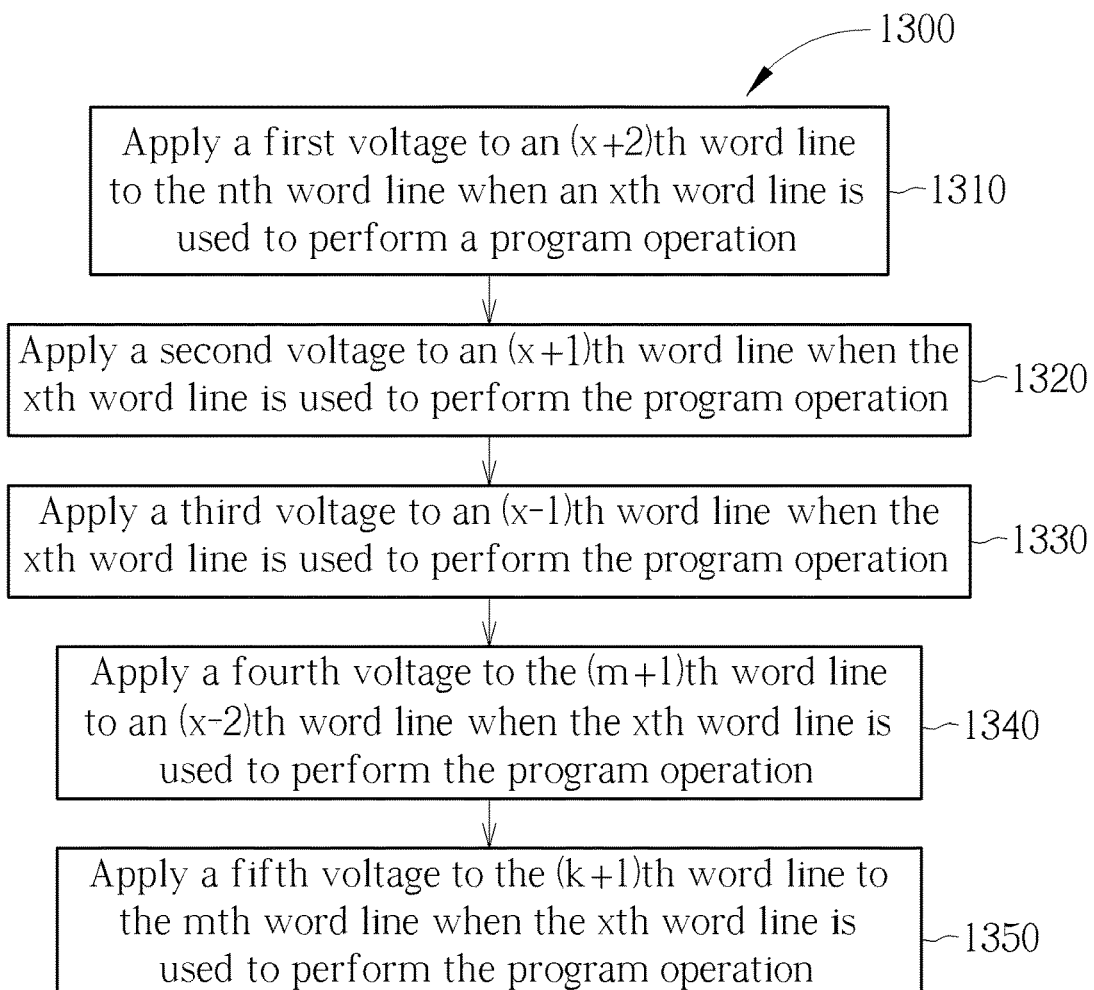
FIG. 13 illustrates a flowchart of an program method according to another embodiment

FIG. 13 illustrates a flowchart of a program method 1300 according to an embodiment. The program method 1300 may be used to operate the memory 700 of FIG. 8, the memory 900 of FIG. 9 and FIG. 10, and the memory 1100 of FIG. 11. The method 1300 may include the following steps.

Step 1310: apply a first voltage V71 to an (x+2)th word line WL(x+2) to the nth word line WLn when an xth word line WLx is used to perform a program operation;

Step 1320: apply a second voltage V72 to an (x+1)th word line WL(x+1);

Step 1330: apply a third voltage V73 to an (x−1)th word line WL(x−1);

Step 1340: apply a fourth voltage V74 to the (m+1)th word line WL(m+1) to an (x−2)th word line WL(x−2); and Step 1350: apply a fifth voltage V75 to the (k+1)th word line WL(k+1) to the mth word line WLm.

Step 1310 to Step 1350 may be performed when the xth word line WLx is used to perform the program operation. In addition, when the xth word line WLx is used to perform the program operation, a six voltage V76 may be applied as shown in FIG. 11 and as described above. The relationships among the voltages (e.g., V71, V72, V73, V74, V75 and V76) shown in FIG. 7 to FIG. 11 may be as described above.

In summary, by using a memory sectioned to have a plurality of portions and applying voltages to the word lines of the memory according to the portions, program disturbance and pass voltage disturbance may be reduced according to simulations and experiments. In addition, by using a same voltage source to apply a voltage to word lines of a same portion or word lines of different portions, less voltage sources may be required, and the area of system may be smaller. Hence, problems of the field can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A memory comprising:
a first portion comprising a first word line to a kth word line from bottom to top; and
a second portion formed above the first portion and comprising a (k+1)th word line to an mth word line from bottom to top; and
a controller configured to apply a first voltage to the first word line to an (x−2)th word line, a second voltage to an (x−1)th word line, and a third voltage to an (x+1)th word line when an xth word line is used to perform a program operation;
wherein x, k and m are positive integers, 1<k<m and 3≤x; the first voltage has a first level if the xth word line is in the first portion;

the first voltage has a second level if the xth word line is in the second portion; and the first level is lower than the second level.

2. The memory of claim 1, wherein the controller is further configured to apply a fourth voltage to an (x+2)th word line to the mth word line when the xth word line is used to perform the program operation, and x<(m−1).

3. The memory of claim 1, further comprising a third portion formed above the second portion and comprising an (m+1)th word line to an nth word line from bottom to top wherein the controller is further configured to apply a fourth voltage to the (x+2)th word line to the nth word line when the xth word line is used to perform the program operation, m<n, and x<(n−1).

4. The memory of claim 3, wherein:

the first voltage has a third level if the xth word line is in the third portion; and the second level is lower than the third level.

5. The memory of claim 1, further comprising:

a lower dummy word line formed above the first portion;

an upper dummy word line formed below the second portion;

a joint oxide layer formed between the lower dummy word line and the upper dummy word line;

wherein the memory has a two-deck structure.

* * * * *